United States Patent
Wu

(10) Patent No.: US 7,983,047 B2
(45) Date of Patent: Jul. 19, 2011

(54) MOUNTING ASSEMBLY FOR HEAT SINK

(75) Inventor: Zhi-Ping Wu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 57 days.

(21) Appl. No.: 12/508,164

(22) Filed: Jul. 23, 2009

(65) Prior Publication Data

US 2010/0290194 A1 Nov. 18, 2010

(30) Foreign Application Priority Data

May 15, 2009 (CN) .................. 2009 1 0302366

(51) Int. Cl.
*H05K 7/20* (2006.01)
(52) U.S. Cl. .............. 361/719; 361/679.54; 361/704; 361/709; 165/80.3; 165/104.33; 174/16.3; 174/252
(58) Field of Classification Search ........ 361/679.46–679.54, 690–697, 361/702–712, 714, 715, 719–728, 732, 735, 361/740–742, 747–748, 759; 165/80.2, 80.3, 165/80.4, 80.5, 104.33, 104.34, 185; 257/706–727; 174/16.1, 16.3, 252, 138; 248/505, 510; 24/297, 457, 458, 508; 29/832, 834, 842
See application file for complete search history.

(56) References Cited

U.S. PATENT DOCUMENTS

| | | | | |
|---|---|---|---|---|
| 5,654,876 A * | 8/1997 | Sathe et al. | | 361/704 |
| 5,754,400 A * | 5/1998 | Sathe et al. | | 361/704 |
| 6,331,937 B1 * | 12/2001 | Bartyzel | | 361/679.54 |
| 6,424,527 B1 * | 7/2002 | Bailey et al. | | 361/679.46 |
| 6,472,742 B1 * | 10/2002 | Bhatia et al. | | 257/713 |
| 6,497,273 B1 * | 12/2002 | Horng et al. | | 165/80.3 |
| 6,501,658 B2 * | 12/2002 | Pearson et al. | | 361/709 |
| 6,549,410 B1 * | 4/2003 | Cohen | | 361/704 |
| 6,611,431 B1 * | 8/2003 | Lee et al. | | 361/719 |
| 6,826,054 B2 * | 11/2004 | Liu | | 361/719 |
| 6,885,557 B2 * | 4/2005 | Unrein | | 361/704 |
| 6,939,742 B2 * | 9/2005 | Bhatia et al. | | 438/117 |
| 7,019,979 B2 * | 3/2006 | Wang et al. | | 361/719 |
| 7,142,422 B2 * | 11/2006 | Lee et al. | | 361/695 |
| 7,142,427 B2 * | 11/2006 | Reents | | 361/704 |
| 7,180,743 B2 * | 2/2007 | Chen et al. | | 361/704 |
| 7,239,518 B2 * | 7/2007 | Yang et al. | | 361/704 |
| 7,262,969 B2 * | 8/2007 | Lee et al. | | 361/704 |
| 7,286,371 B2 * | 10/2007 | Unrein | | 361/810 |
| 7,336,496 B1 * | 2/2008 | Hsu | | 361/719 |
| 7,391,617 B2 * | 6/2008 | Veh | | 361/719 |
| 7,443,682 B2 * | 10/2008 | Fan et al. | | 361/709 |
| 7,468,889 B2 * | 12/2008 | Su | | 361/719 |
| 7,495,922 B2 * | 2/2009 | Ploeg et al. | | 361/719 |
| 7,576,989 B2 * | 8/2009 | Li et al. | | 361/719 |
| 7,667,970 B2 * | 2/2010 | Ma et al. | | 361/704 |
| 7,764,503 B2 * | 7/2010 | Zha | | 361/704 |

* cited by examiner

*Primary Examiner* — Michael V Datskovskiy
(74) *Attorney, Agent, or Firm* — D. Austin Bonderer

(57) ABSTRACT

A mounting assembly includes a circuit board, a chip socket mounted on a topside of the circuit board with a chip attached thereon, a heat sink positioned on a top surface of the chip, and a backplate attached to an underside of the circuit board. The heat sink includes a pair of securing legs at two corners of the heat sink, and a pair of securing members. Each securing leg defines a securing hole thereon. Each securing member includes a spring thereon positioned between the corresponding securing legs and the circuit board. The securing members are secured in the corresponding securing holes to secure the heat sink to the circuit board.

10 Claims, 2 Drawing Sheets

MOUNTING ASSEMBLY FOR HEAT SINK

BACKGROUND

1. Technical Field

The present disclosure relates to a mounting assembly and, particularly, to a mounting assembly for a heat sink which effectively protects a computer chip socket.

2. Description of Related Art

A conventional printed circuit board assembly (PCBA) includes a circuit board, a plurality of electronic components mounted on the circuit board, and a plurality of tin balls attached on the circuit board for electrically connecting the electronic components to the circuit board. However, if an electronic component, such as a CPU chip socket with a heat sink mounted thereon, endures much stress, the circuit board may be deformed and the tin balls at a bottom of the CPU chip socket broken, causing broken the electrical connections.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
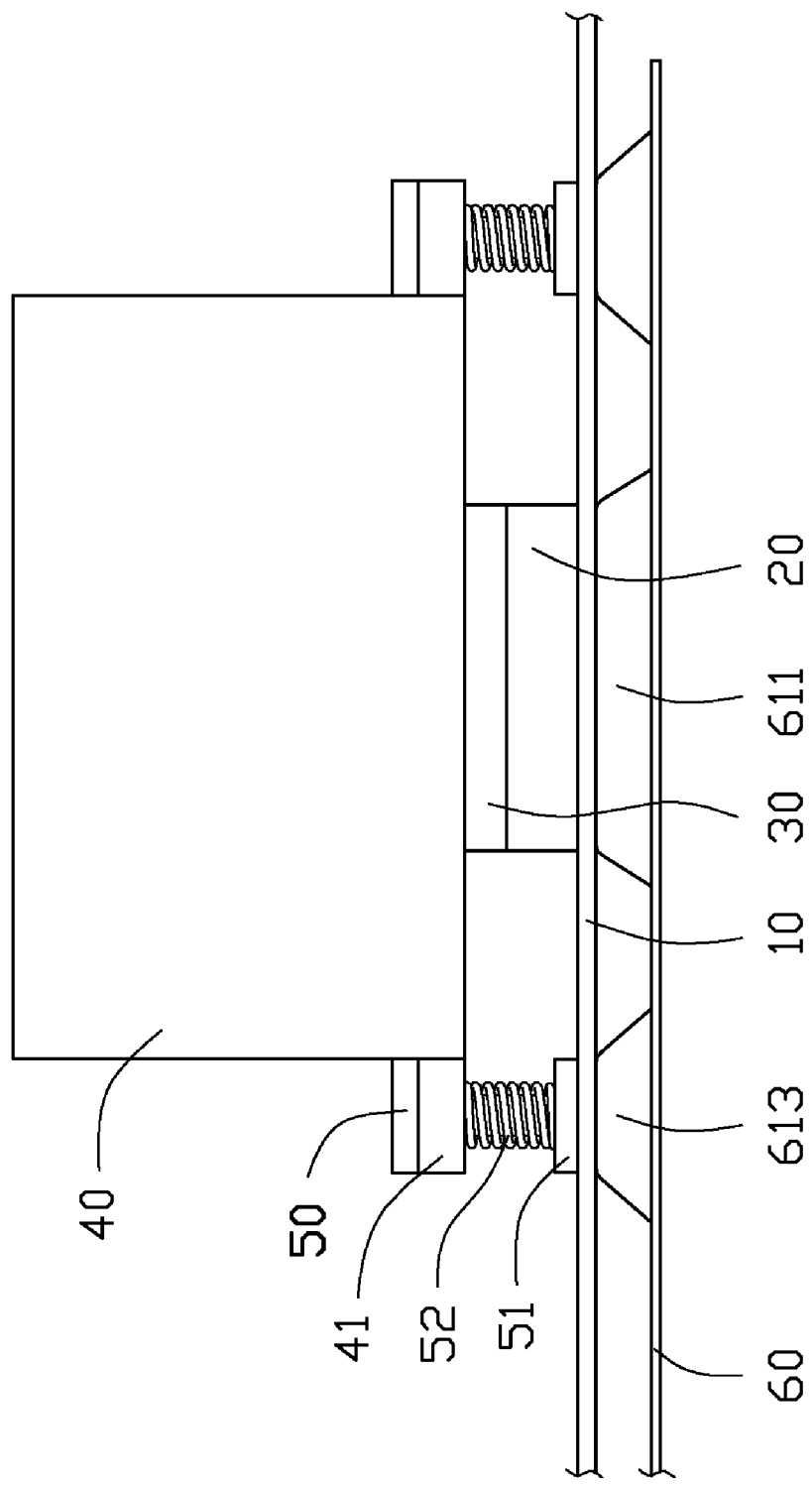
FIG. 1 is an assembled view of an embodiment of a mounting assembly, which includes a circuit board, and a backplate mounted on the circuit board.
Figure 2:
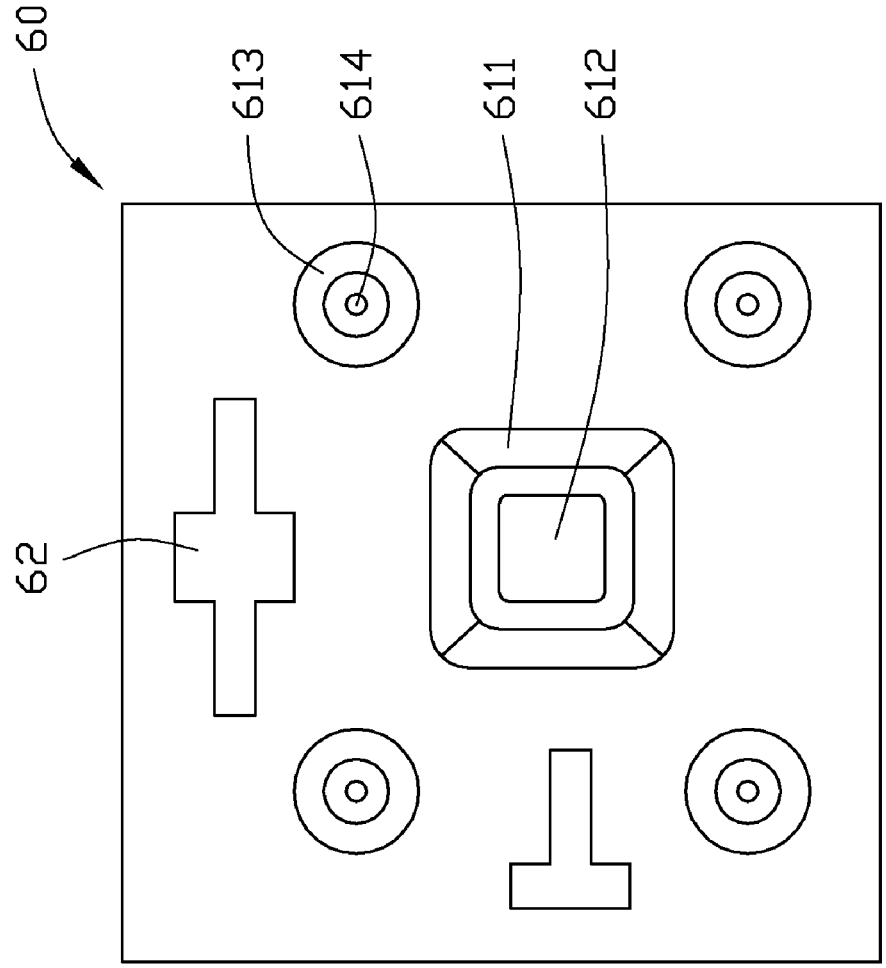
FIG. 2 is top view of the backplate of FIG. 1.

FIG. 1 is an assembled view of an embodiment of a mounting assembly. The mounting assembly includes a circuit board 10, a CPU chip socket 20 mounted on the circuit board 10, a CPU chip 30 positioned on the CPU chip socket 20, a heat sink 40 positioned on the CPU chip 30, and an integrally molded backplate 60 attached to an underside of the circuit board 10 for reinforcing the circuit board 10. The CPU chip 30 is electrically connected to the circuit board 10 via a plurality of tin balls (not shown) mounted on a bottom of the CPU chip socket 20.

The heat sink 40 includes a securing leg 41 at each of four corners thereof. Each securing leg 41 defines a securing hole (not shown) thereon. Four securing members 50 pass through the corresponding securing holes to secure the heat sink 40 to the circuit board 10. Each securing member 50 includes a snap ring 51 thereon between the corresponding securing legs 41 and the circuit board 10, and a spring 52 thereon between the corresponding securing legs 41 and the snap rings 51.

The backplate 60 includes a raised stand 611 abutting the underside of the circuit board 10 below the CPU chip socket 20. A quadrate opening 612 is defined in the raised stand 611 for avoiding unwanted contact between the backplate 60 and the circuit board 10. The backplate 60 further includes four circular protrusions 613 each defining a through hole 614 therein corresponding to the securing members 50 of the heat sink 40. A plurality of mounting openings 62 is defined on the backplate 60 for securing the mounting assembly in a chassis having a corresponding mounting piece for engaging the mounting openings 62. While the mounting openings 62, as disclosed, are cross-shaped or T-shaped, other shapes are equally applicable.

Due to positioning of the springs 52 on the securing members 50 between the corresponding securing legs 41 and the snap rings 51, the heat sink 40 produces an elastic force opposite to the fixing force of the securing members 50. Stress on the tin balls mounted between the CPU chip socket 20 and the circuit board 10 is thus decreased. Further, due to the backplate 60 attached to the circuit board 10, the circuit board 10 has added support and is less easily deformed by stress. Thus, tin balls mounted between the CPU chip socket 20 and the circuit board 10 are protected from deformation. Reliability of the electrical connection between the CPU chip socket 20 and the circuit board 10 is further enhanced.

A simulation application LS-DYNA simulates stress distribution on the tin balls when the mounting assembly suffers an impact. The simulated conditions are set to: initial velocity of the mounting assembly, 3.22 meters/second when the mounting assembly experiences impact. The maximum acceleration is determined to be 30 times that of gravity when the mounting assembly is impacted. The simulation according to the set conditions shows that the maximum stress on the tin balls is 93.8 Mpa when using the mounting assembly of the disclosure, and 194.3 Mpa when using a commonly used mounting assembly. Accordingly, when the mounting assembly of FIG. 1 suffers impact, damage to the tin balls is minimized or eliminated.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the invention to the full extent indicated by the broad general meaning of the terms in which the appended claims are expressed.

What is claimed is:

1. A mounting assembly comprising:
    a circuit board;
    a chip socket mounted on a topside of the circuit board with a chip attached thereon;
    a heat sink positioned on a top surface of the chip, the heat sink comprising:
        at least a pair of securing legs, each securing leg defining a securing hole thereon; and
    at least a pair of securing members, corresponding to the at least a pair of securing legs, extending through the corresponding securing holes and secured to the circuit board to fix the heat sink on the circuit board, each securing member comprising a spring thereon positioned between the corresponding securing leg and the circuit board; wherein each securing leg is located between the corresponding securing member and spring; and
    a backplate attached to an underside of the circuit board.

2. The mounting assembly of claim 1, wherein each securing member further comprises a snap ring thereon between the corresponding securing legs and the circuit board, the spring being positioned on the securing member between the corresponding securing leg and the snap ring.

3. The mounting assembly of claim 1, wherein the backplate comprises a raised stand thereon abutting the underside of the circuit board below the chip socket.

4. The mounting assembly of claim 3, wherein the raised stand defines a quadrate opening therein.

5. The mounting assembly of claim 3, wherein the raised stand comprises at least a pair of circular protrusions each having a through hole defined therein corresponding to the securing members.

6. The mounting assembly of claim 1, wherein at least one cross-shaped mounting opening is defined on the backplate securing the circuit board assembly to a chassis.

7. The mounting assembly of claim 1, wherein the chip attached on the chip socket is a CPU chip.

8. A mounting assembly comprising:
a circuit board;
a chip socket mounted on a topside of circuit board with a chip attached thereon;
a heat sink positioned on a top surface of the chip, the heat sink comprising:
four securing legs, each securing leg defining a securing hole therein; and
four securing members, corresponding to the four securing legs, extending through the corresponding securing holes and secured to the circuit board to fix the heat sink to the circuit board, each securing member comprising a spring thereon positioned between the corresponding securing leg and the circuit board; wherein each securing leg is located between the corresponding securing member and spring; and
a backplate attached to an underside of the circuit board, the backplate comprising a pair of circular protrusions corresponding to the securing members.

9. The mounting assembly of claim 8, wherein the backplate further comprises a raised stand that abuts the underside of the circuit board below the chip socket.

10. The mounting assembly of claim 8, wherein a plurality of mounting openings is defined on the backplate, the mounting openings are L-shaped or T-shaped.

* * * * *